(12) United States Patent
Hashimoto et al.

(10) Patent No.: US 9,418,944 B2
(45) Date of Patent: Aug. 16, 2016

(54) SEMICONDUCTOR PACKAGE

(71) Applicant: J-DEVICES CORPORATION, Oita (JP)

(72) Inventors: Kiyoaki Hashimoto, Ishikawa (JP); Yasuyuki Takehara, Ishikawa (JP)

(73) Assignee: J-DEVICES CORPORATION, Oita (JP)

( * ) Notice: Subject to any disclaimer, the term of this patent is extended or adjusted under 35 U.S.C. 154(b) by 0 days.

(21) Appl. No.: 14/739,829

(22) Filed: Jun. 15, 2015

(65) Prior Publication Data

US 2015/0371915 A1    Dec. 24, 2015

(30) Foreign Application Priority Data

Jun. 19, 2014 (JP) ................ 2014-125982
Mar. 26, 2015 (JP) ................ 2015-063728
May 26, 2015 (JP) ................ 2015-106230

(51) Int. Cl.
| | |
|---|---|
| *H01L 23/00* | (2006.01) |
| *H01L 23/544* | (2006.01) |
| *H01L 23/36* | (2006.01) |
| *H01L 23/373* | (2006.01) |
| *H01L 21/48* | (2006.01) |
| *H01L 23/31* | (2006.01) |
| *H01L 21/56* | (2006.01) |
| *H01L 23/498* | (2006.01) |

(Continued)

(52) U.S. Cl.
CPC .......... *H01L 23/544* (2013.01); *H01L 21/4857* (2013.01); *H01L 21/561* (2013.01); *H01L 23/3128* (2013.01); *H01L 23/36* (2013.01); *H01L 23/3735* (2013.01); *H01L 23/562* (2013.01); *H01L 24/19* (2013.01); *H01L 24/97* (2013.01); *H01L 21/568* (2013.01); *H01L 23/49816* (2013.01); *H01L 2223/54426* (2013.01); *H01L 2223/54486* (2013.01); *H01L 2224/04105* (2013.01); *H01L 2224/12105* (2013.01); *H01L 2224/32225* (2013.01); *H01L 2224/32245* (2013.01); *H01L 2224/73267* (2013.01); *H01L 2224/92244* (2013.01); *H01L 2224/97* (2013.01); *H01L 2924/3511* (2013.01)

(58) Field of Classification Search
CPC ............ H01L 23/3135; H01L 23/5227; H01L 23/562; H01L 23/544; H01L 23/5228; H01L 23/528; H01L 23/5222; H01L 2223/54426
See application file for complete search history.

(56) References Cited

U.S. PATENT DOCUMENTS

| 6,708,398 | B2 * | 3/2004 | Wakashima | .......... H01L 21/486 257/E23.069 |
|---|---|---|---|---|
| 7,256,431 | B2 * | 8/2007 | Okamoto | ................. C23C 4/02 257/177 |
| 7,659,559 | B2 * | 2/2010 | Lee | ..................... H01L 23/4334 257/177 |

FOREIGN PATENT DOCUMENTS

JP    2010-040911 A    2/2010

*Primary Examiner* — Nikolay Yushin
(74) *Attorney, Agent, or Firm* — Typha IP LLC

(57) ABSTRACT

A semiconductor package includes a support substrate; a stress relaxation layer provided on a main surface of the support substrate; a semiconductor device located on the stress relaxation layer; an encapsulation material covering the semiconductor device, the encapsulation material being formed of an insulating material different from that of the stress relaxation layer; a line running through the encapsulation material and electrically connected to the semiconductor device; and an external terminal electrically connected to the line. Where the support substrate has an elastic modulus of A, the stress relaxation layer has an elastic modulus of B, and the encapsulation material has an elastic modulus of C under a same temperature condition, the relationship of A>C>B or C>A>B is obtained.

11 Claims, 22 Drawing Sheets

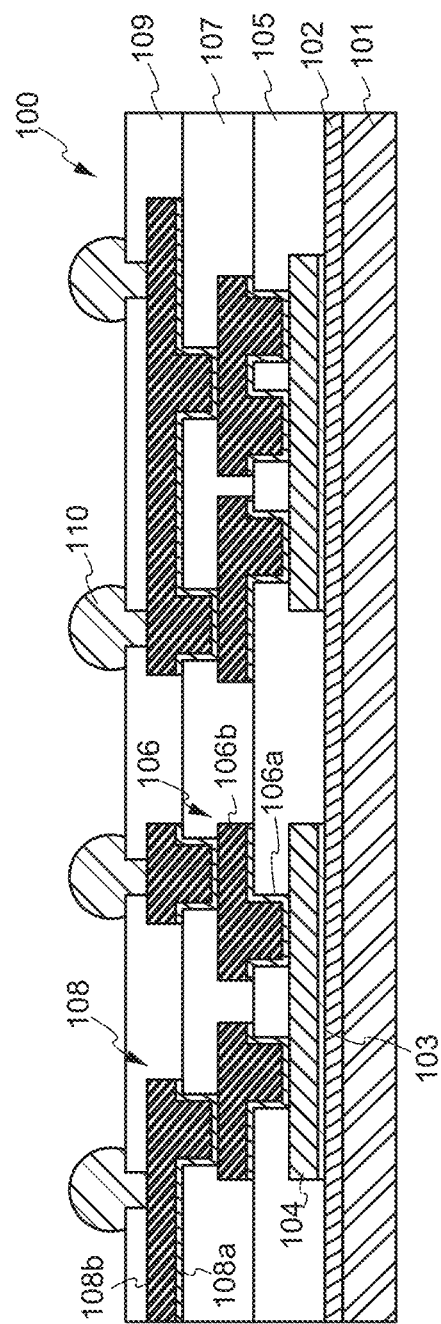

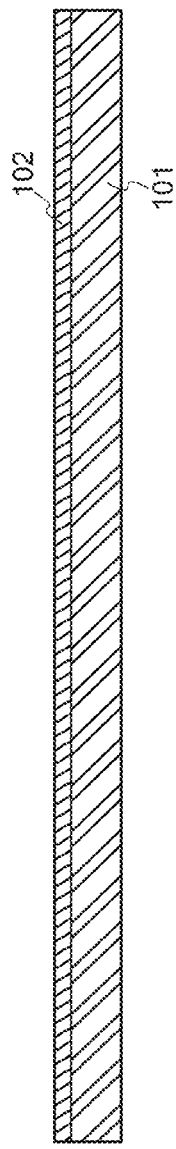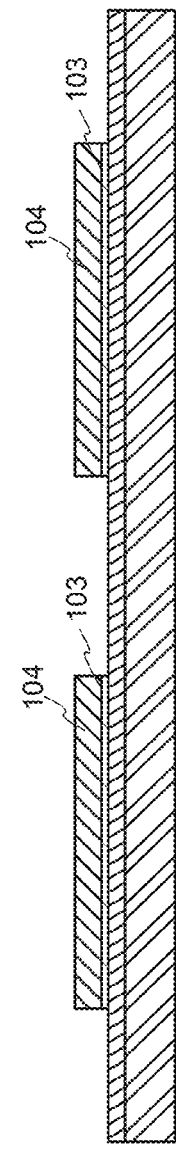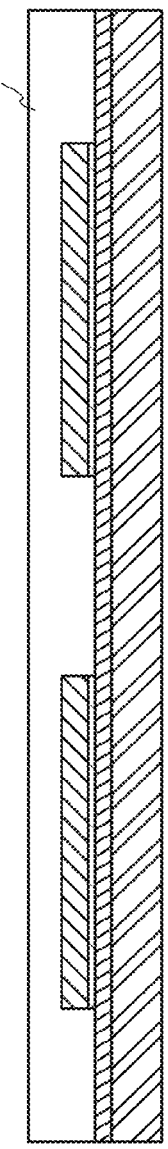

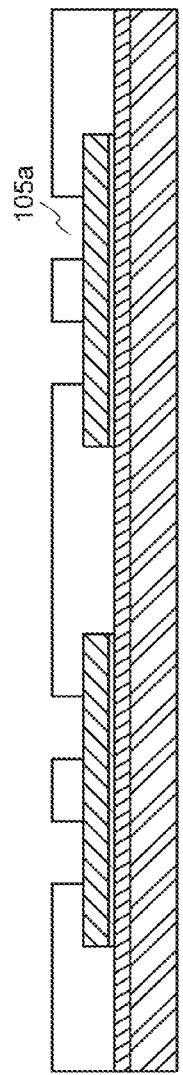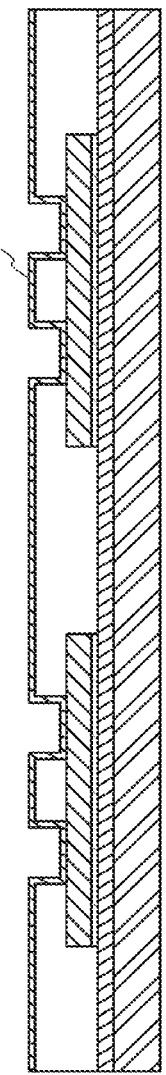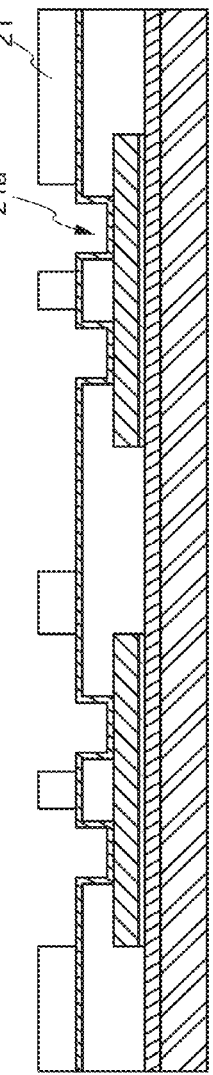

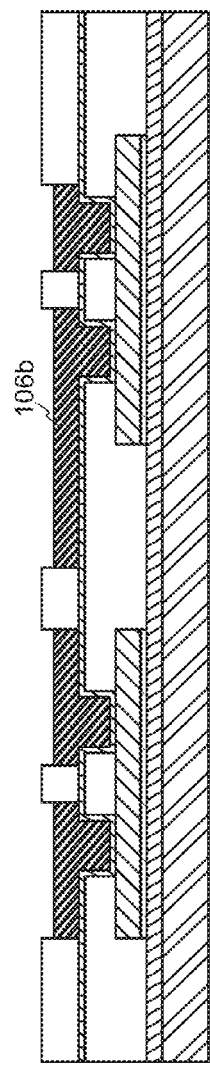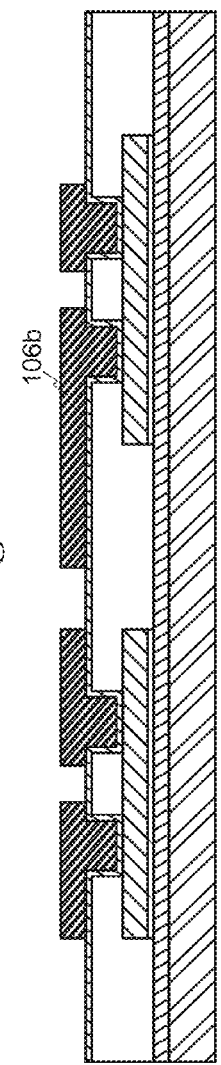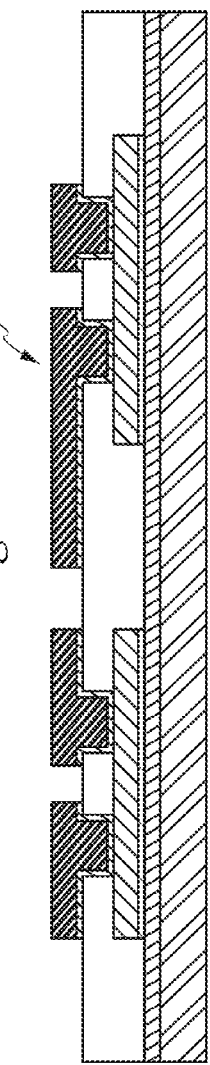

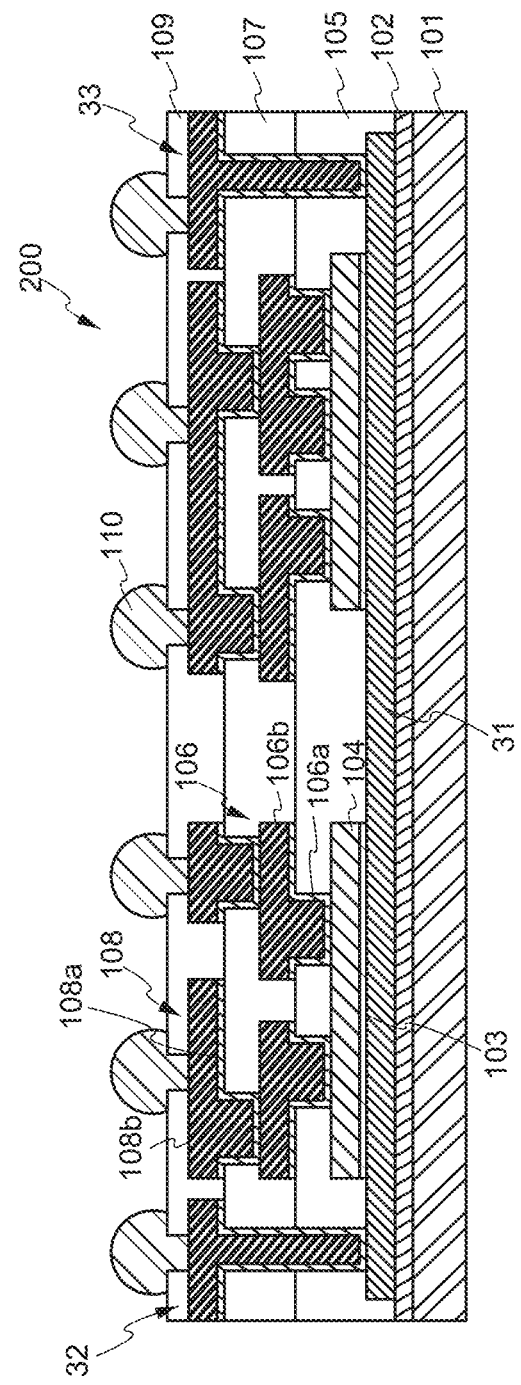

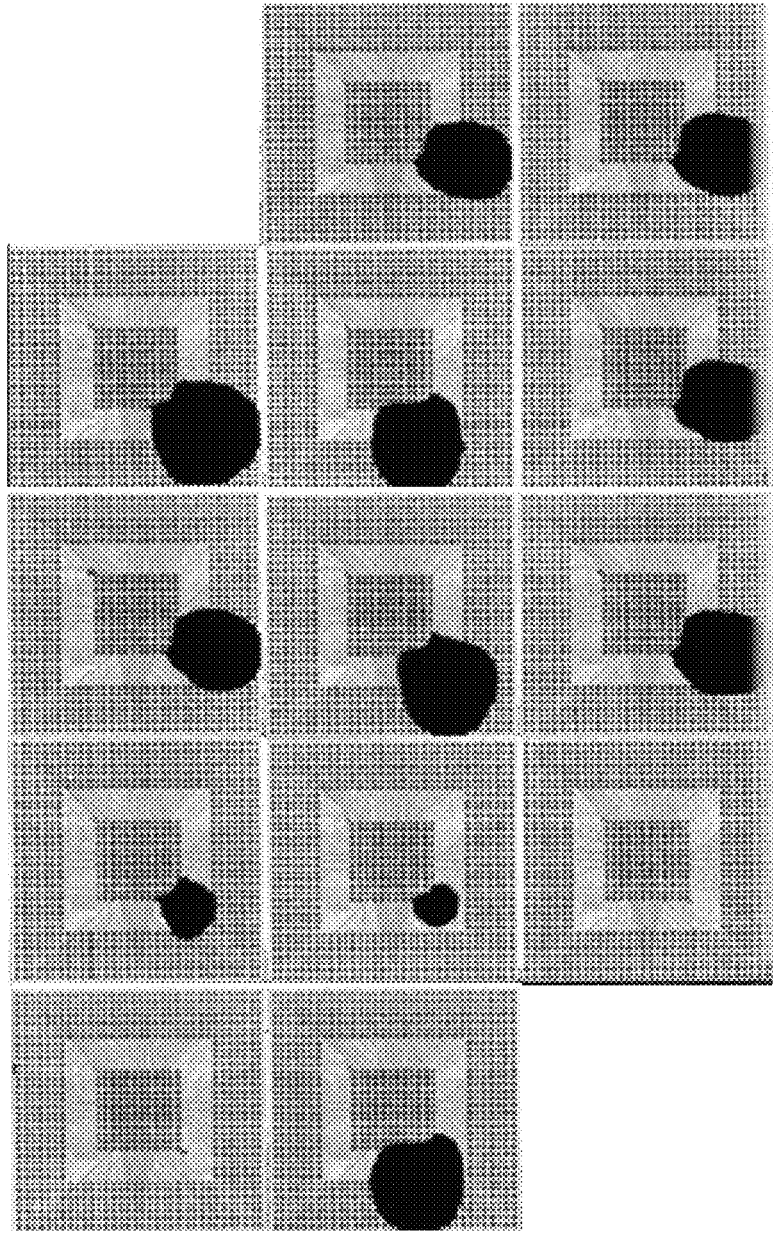

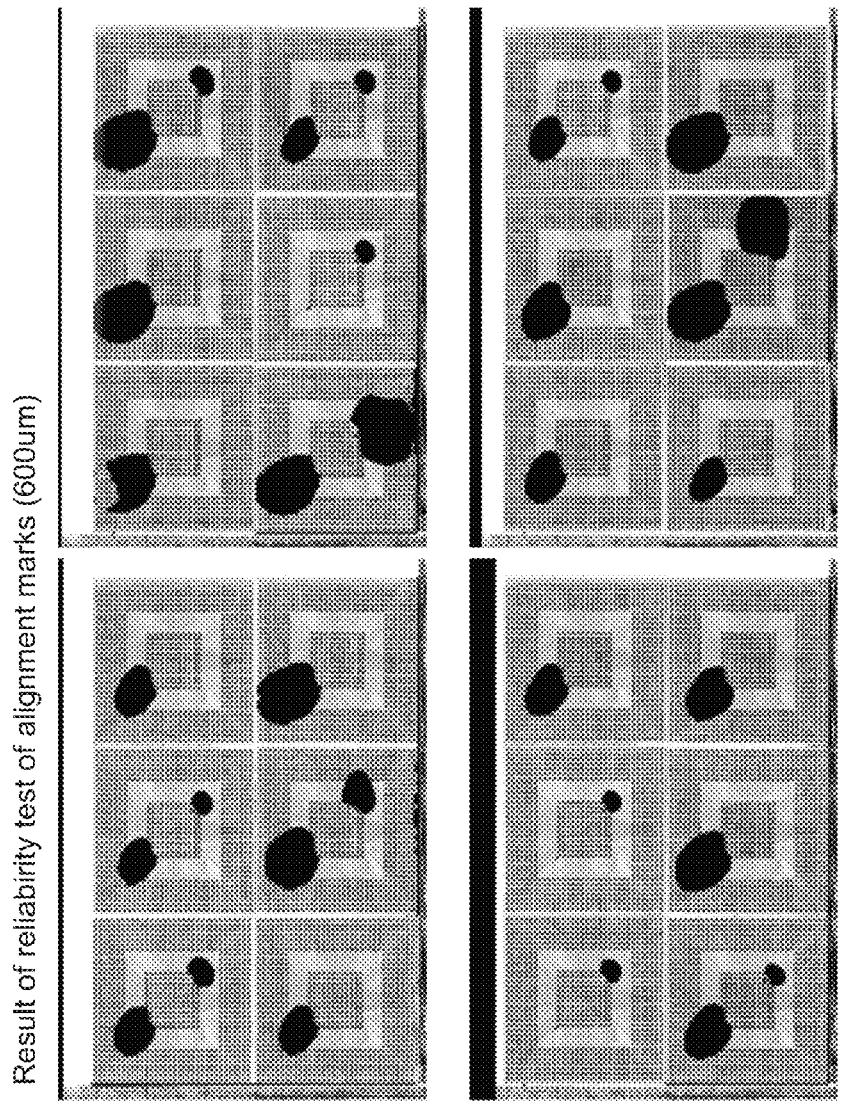
Fig.17 Result of reliabirity test of alignment marks (600um)

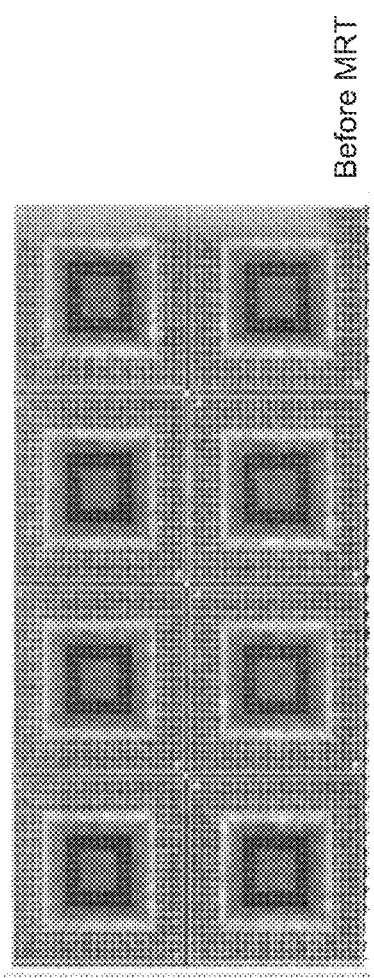
Fig.18A Before MRT
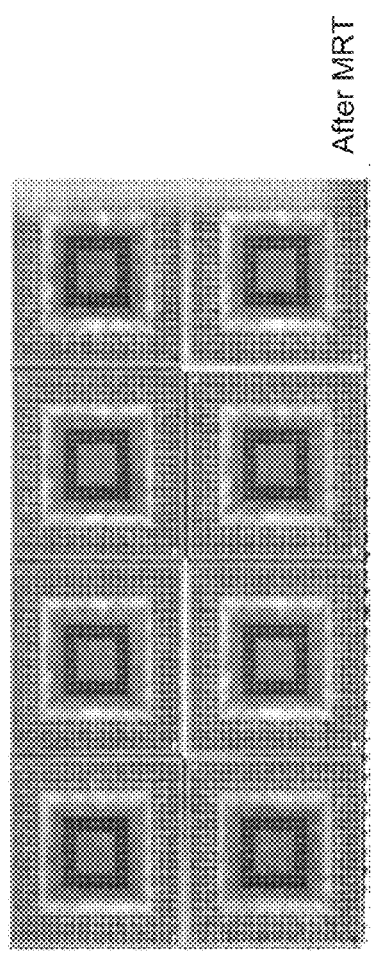
Fig.18B After MRT

SEMICONDUCTOR PACKAGE

CROSS REFERENCE TO RELATED APPLICATIONS

This application is based upon and claims the benefit of priority from the prior Japanese Patent Application No. 2014-125982, filed on 19 Jun. 2014, the prior Japanese Patent Application No. 2015-063728, filed on 26 Mar. 2015 and the prior Japanese Patent Application No. 2015-106230, filed on 26 May 2015, the entire contents of which are incorporated herein by reference.

FIELD

The present invention relates to a mounting technology for a semiconductor package, and specifically to a technology for relaxing a stress caused during production of a semiconductor package.

BACKGROUND

Conventionally, a semiconductor package structure including a semiconductor device such as an IC chip or the like mounted on a support substrate is known. Generally in such a semiconductor package structure, a semiconductor device such as an IC chip or the like is bonded to a support substrate via an adhesive material called a die attach material, and the semiconductor device is covered with an encapsulation material (formed of a sealing resin) for protection.

As the support substrate for the semiconductor package, any of various types of substrates including a printed circuit board, a ceramic substrate and the like is used. Especially recently, semiconductor packages using a metal substrate have been actively developed. A semiconductor package using a metal substrate has advantages of being high in electromagnetic shielding properties and thermal characteristics, and is now a target of attention as a highly reliable semiconductor package.

However, a metal material and a resin are significantly different in the coefficient of thermal expansion (CTE). Therefore, there is a problem in the production of a semiconductor package using a metal substrate that an internal stress is caused due to the difference in the coefficient of thermal expansion between the metal substrate and an encapsulation material (formed of a resin used to protect a semiconductor device), resulting in a warp of the encapsulation material (Japanese Laid-Open Patent Publication No. 2010-40911).

SUMMARY

A semiconductor package in an embodiment according to the present invention includes a support substrate; a stress relaxation layer provided on a main surface of the support substrate; a semiconductor device located on the stress relaxation layer; an encapsulation material covering the semiconductor device, the encapsulation material being formed of an insulating material different from that of the stress relaxation layer; a line running through the encapsulation material and electrically connected to the semiconductor device; and an external terminal electrically connected to the line.

A semiconductor package in an embodiment according to the present invention includes a support substrate; a stress relaxation layer provided on a main surface of the support substrate; a conductive layer provided on the stress relaxation layer; a semiconductor device located on the conductive layer; an encapsulation material covering the semiconductor device, the encapsulation material being formed of an insulating material different from that of the stress relaxation layer; a line running through the encapsulation material and electrically connected to the semiconductor device; and an external terminal electrically connected to the line.

A semiconductor package in an embodiment according to the present invention includes a support substrate; a stress relaxation layer provided on a main surface of the support substrate; a conductive layer provided on the stress relaxation layer; a semiconductor device surrounded by the conductive layer and located on the stress relaxation layer; an encapsulation material covering the semiconductor device, the encapsulation material being formed of an insulating material different from that of the stress relaxation layer; a line running through the encapsulation material and electrically connected to the semiconductor device; and an external terminal electrically connected to the line.

A method for producing a semiconductor package in an embodiment according to the present invention includes the steps of forming a stress relaxation layer on a main surface of a support substrate; forming at least one semiconductor device on the stress relaxation layer; covering the semiconductor device with an encapsulation material formed of an insulating material different from that of the stress relaxation layer; forming a line running through the encapsulation material and electrically connected to the semiconductor device; and forming an external terminal electrically connected to the line.

A method for producing a semiconductor package in an embodiment according to the present invention includes the steps of forming a stress relaxation layer on a main surface of a support substrate; forming a conductive layer on the stress relaxation layer; forming at least one semiconductor device on the conductive layer; covering the semiconductor device with an encapsulation material formed of an insulating material different from that of the stress relaxation layer; forming a line running through the encapsulation material and electrically connected to the semiconductor device; and forming an external terminal electrically connected to the line.

A method for producing a semiconductor package in an embodiment according to the present invention includes the steps of forming a stress relaxation layer on a main surface of a support substrate; forming a conductive layer on the stress relaxation layer; etching the conductive layer to expose the stress relaxation layer; forming at least one semiconductor device on the exposed area of the stress relaxation layer; covering the semiconductor device with an encapsulation material formed of an insulating material different from that of the stress relaxation layer; forming a line running through the encapsulation material and electrically connected to the semiconductor device; and forming an external terminal electrically connected to the line.

According to the present invention, a highly reliable semiconductor package which alleviates an internal stress caused between a support substrate and an encapsulation material is realized.

BRIEF EXPLANATION OF DRAWINGS

FIG. 2 is a cross-sectional view of the semiconductor package in embodiment 1 according to the present invention;

FIG. 3A shows a step of a method for producing the semiconductor package in embodiment 1 according to the present invention;

FIG. 3B shows a step of the method for producing the semiconductor package in embodiment 1 according to the present invention;

FIG. 3C shows a step of the method for producing the semiconductor package in embodiment 1 according to the present invention;

FIG. 4A shows a step of the method for producing the semiconductor package in embodiment 1 according to the present invention;

FIG. 4B shows a step of the method for producing the semiconductor package in embodiment 1 according to the present invention;

FIG. 4C shows a step of the method for producing the semiconductor package in embodiment 1 according to the present invention;

FIG. 5A shows a step of the method for producing the semiconductor package in embodiment 1 according to the present invention;

FIG. 5B shows a step of the method for producing the semiconductor package in embodiment 1 according to the present invention;

FIG. 5C shows a step of the method for producing the semiconductor package in embodiment 1 according to the present invention;

FIG. 7A is a cross-sectional view of a semiconductor package in embodiment 2 according to the present invention;

FIG. 16 shows results of the reliability test in the case where openings each having a side of a length of 500 μm are formed in embodiment 6 according to the present invention;

FIG. 17 shows results of the reliability test in the case where openings each having a side of a length of 600 μm are formed in embodiment 6 according to the present invention;

FIG. 18A shows semiconductor packages, in embodiment 6 according to the present invention, with openings each having a side of a length of 400 μm before a reliability test is performed; and FIG. 18B shows semiconductor packages, in embodiment 6 according to the present invention, with openings each having a side of a length of 400 μm after the reliability test is performed.

DESCRIPTION OF EMBODIMENTS

Figure 1:
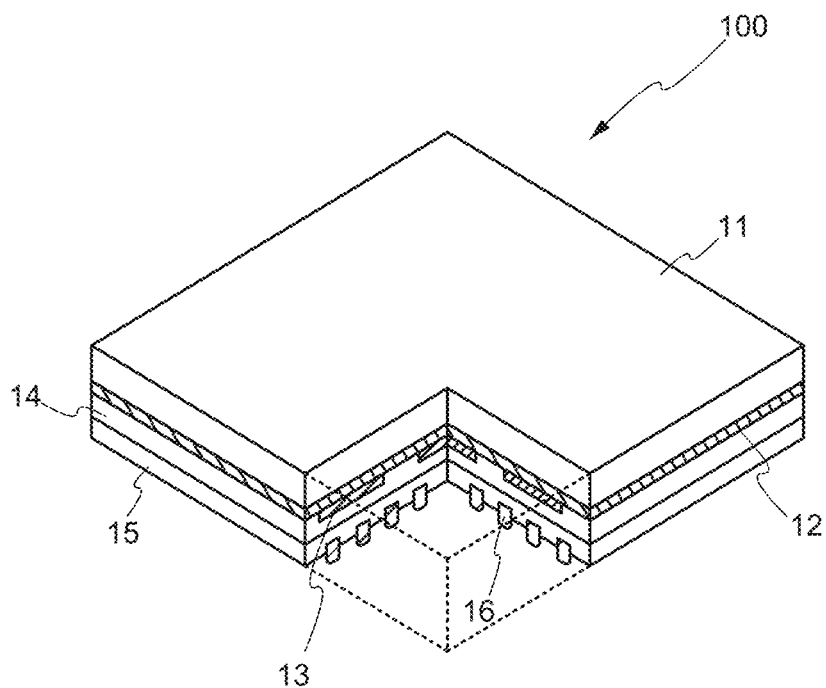
FIG. 1 shows an external appearance of a semiconductor package in embodiment 1 according to the present invention.

The present invention made in light of the above-described problem has an object of providing a highly reliable semiconductor package which alleviates an internal stress caused between a support substrate and an encapsulation material.

Hereinafter, a semiconductor package in embodiments according to the present invention will be described in detail with reference to the drawings. The embodiments described below are merely examples, and the present invention is not limited to the following embodiments in any way.

In the drawings referred to in the following embodiments, identical components or components having substantially the same functions will bear identical reference signs or similar signs (with, for example, letters such as A, B or the like after the same reference numerals), and the same descriptions may not be repeated. In the drawings, the ratio of sizes may be different from the actual ratio of sizes, or a part of the components may be omitted, for the convenience of description.

In this specification, the term "on", "upper" or any other term relating to the upward direction refers to a relative position with respect to a main surface of a support substrate (surface on which a semiconductor device is located), and also a direction of being distanced from the main surface of the support substrate. In the cross-sectional views, for example, FIG. 2, the upward direction as seen from a viewer viewing the sheet of paper is referred to by the term "on", "upper" or the like. When it is expressed that a component is "on" another component, it may be indicated that the first component is located upward with respect to the another component while being in contact therewith, or it may be indicated that the first component is located upward with respect to the another component while being out of contact therewith.

Embodiment 1

External Appearance of the Package

FIG. 1 is an external view of a semiconductor package 100 in embodiment 1 according to the present invention. In FIG. 1, the semiconductor package 100 is shown as being cut away in a lower part of the sheet of paper in order to show an external structure.

In FIG. 1, reference sign 11 represents a support substrate, and reference sign 12 represents a stress relaxation layer provided on a main surface of the support substrate 11. Reference sign 13 represents a semiconductor device such as an IC chip, an LSI chip or the like. Reference signs 14 and 15 each represent an encapsulation material (formed of a sealing resin) provided to protect the semiconductor device 13. Although not shown in FIG. 1, the encapsulation materials 14 and 15 have lines formed thereon, and the lines connect an output terminal of the semiconductor device 13 and solder balls 16 each acting as an external terminal.

As can be seen, the semiconductor package 100 in this embodiment has a structure in which the support substrate 11 is used as a substrate as it is, and the resin layers stacked on each other (encapsulation materials 14 and 15) protect the semiconductor device 13 from outside air.

<Package Structure>

FIG. 2 is a cross-sectional view provided to show the structure of the semiconductor package 100 shown in FIG. 1 in detail. Reference sign 101 represents a support substrate, which is a metal substrate in this example. The metal substrate may be, for example, an iron alloy substrate such as a stainless steel substrate or the like, or a copper alloy substrate. Needless to say, the support substrate 101 is not limited to a metal substrate, and a silicon substrate, a glass substrate, a ceramic substrate, an organic material substrate or the like may be used in accordance with the use or the cost.

On the support substrate 101, a stress relaxation layer 102 is provided. The stress relaxation layer 102 is an insulating layer provided to alleviate the stress caused between the support substrate 101 and an encapsulation material 105 described later. The stress relaxation layer 102 will be described in detail later. In the semiconductor package 100 in this embodiment, the stress relaxation layer 102 is formed of a thermosetting resin or a thermoplastic resin (e.g., epoxy resin) and has a thickness of 10 to 200 μm. Alternatively, the stress relaxation layer 102 may be formed of a material containing an inorganic material or a metal filler each having an improved thermal conductivity.

On the stress relaxation layer 102, semiconductor devices 104 are provided via adhesive members (formed of a die attach material) 103. The adhesive members 103 may each be a known adhesive member that bonds a support substrate and a semiconductor device to each other (in this example, an adhesive member that bonds the stress relaxation layer 102 and the semiconductor device 104 to each other). In this embodiment, a die attach film is used as each adhesive member 103.

In this embodiment, the semiconductor devices 104 are bonded with the adhesive members 103. Alternatively, the semiconductor devices 104 may be provided directly on the stress relaxation layer 102 with the adhesive members 103 being omitted.

The semiconductor devices 104 are each a semiconductor element such as an IC chip, an LSI chip or the like. The semiconductor devices 104 are located on the stress relaxation layer 102 by a known dicing step and a die-bonding step. In the example shown in FIG. 2, two semiconductor devices 104 are located on the support substrate 101. Alternatively, a larger number of semiconductor devices 104 may be located on the support substrate 101. In this case, the mass productivity of the semiconductor devices 104 is improved. For example, 500 or more semiconductor devices 104 may be located on a large substrate having a size of, for example, 500 mm×400 mm. (In this and the following embodiments, the description may be made regarding one semiconductor device for the sake of convenience.)

The semiconductor device 104 has a top surface and a side surface thereof covered with a first encapsulation material 105 and thus is protected from an external environment. The first encapsulation material 105 may be formed of an epoxy-based resin or any other known sealing resin.

On the first encapsulation material 105, first line layers 106 are provided. In this example, the first line layers 106 each include a copper seed layer 106a and a copper line 106b. Needless to say, the first line layers 106 may be formed of any known material that provides a good electrical connection with the semiconductor device 104, for example, aluminum, silver or the like, instead of copper.

On the first line layers 106, a second encapsulation material 107 and second line layers 108 are provided. The second encapsulation material 107 may be formed of the same material as that of the first encapsulation material 105 and will not be described in detail. The second line layers 108 each include a copper seed layer 108a and a copper line 108b. In this embodiment, a line layer having a two-layer structure including the first line layer 106 and the second line layer 108 is used. The number of line layers may be larger or smaller, and may be determined as necessary.

On the second line layers 108, a third encapsulation material (formed of a known solder resist) 109 is provided. On the third encapsulation material 109, solder balls are provided as external terminals 110 via openings. In this example, the third encapsulation material 109 is formed of a solder resist. Alternatively, the third encapsulation material 109 may be formed of the same material as that of the first encapsulation material 105 and the second encapsulation material 107. Still alternatively, the third encapsulation material 109 may be formed of a material having a higher function as a protective film because the third encapsulation material 109 is exposed to outside air. The external terminals 110 formed of the solder balls may be formed by a reflow process at a temperature around 260° C.

The semiconductor package 100 in embodiment 1 according to the present invention described above includes the stress relaxation layer 102 provided on the main surface of the support substrate 101. Because of this, a stress caused due to a difference in property values (especially, elastic modulus or coefficient of linear thermal expansion) between the support substrate 101 and the first encapsulation material 105 is alleviated. Hereinafter, the properties of the stress relaxation layer 102 will be described.

In the semiconductor package 100 in embodiment 1 according to the present invention, the stress relaxation layer 102 has a role of relaxing the internal stress caused due to a difference in property values between the support substrate 101 and the first encapsulation material 105 (stress caused at a border face between the support substrate 101 and the first encapsulation material 105). Therefore, the stress relaxation layer 102 is desirably an insulating layer having an elastic modulus smaller than that of the support substrate 101 and of the first encapsulation material 105.

Specifically, a combination of the materials of the support substrate 101, the stress relaxation layer 102 and the first encapsulation material 105 may be determined such that where the elastic modulus of the support substrate 101 is A, the elastic modulus of the stress relaxation layer 102 is B, and the elastic modulus of the first encapsulation material is C under the same temperature condition, the relationship of A>C>B or C>A>B is obtained.

As can be seen, it is desirable that the stress relaxation layer 102 has a low elastic modulus. For example, the elastic modulus of the stress relaxation layer 102 is desirably 2 GPa or less in a temperature range of about 25° C. (room temperature) and 100 MPa or less in a temperature range exceeding 100° C. The upper limit is provided for the elastic modulus in each of the temperature ranges because when the elastic modulus exceeds the respective upper limit, the stress relaxation layer 102 becomes too hard and the function thereof as a stress relaxation layer is alleviated.

This will be described in more detail. At room temperature, the stress relaxation layer 102 functions as a stress relaxation layer even if being hard to some extent (even if having a high elastic modulus). Therefore, the elastic modulus of the stress relaxation layer 102 is set to 2 GPa at the highest. By contrast, in the temperature range exceeding 100° C. (for example, in the temperature range exceeding 150° C.), for example, at a temperature at which a thermosetting resin is cured (around 170° C.) or in the vicinity thereof, the elastic modulus of the stress relaxation layer 102 is set to 100 MPa. A reason for this is that if the elastic modulus exceeds 100 MPa in such a high temperature range, the stress relaxation layer 102 cannot function as a stress relaxation layer.

The stress relaxation layer 102 has a higher functionality of relaxing the stress as having a lower elastic modulus. However, when the elastic modulus is too low, the fluidity thereof becomes too high, and the stress relaxation layer 102 may possibly not keep the shape thereof as a layer. Therefore, in this embodiment, the stress relaxation layer 102 has such an elastic modulus that keeps the shape thereof in a temperature range from room temperature to 260° C. (reflow temperature described later), although the lower limit is not specifically provided for the elastic modulus.

Now, it is assumed that an insulating layer that fulfills the above-described relationship of the elastic modulus is used as the stress relaxation layer 102. In this case, where the coefficient of linear thermal expansion of the support substrate 101 is a, the coefficient of linear thermal expansion of the stress relaxation layer 102 is b, and the coefficient of linear thermal expansion of the first encapsulation material 105 is c under the same temperature condition, the relationship of a≤c<b (or a≈c<b) is obtained.

In general, the coefficient of linear thermal expansion of a metal substrate is about 20 ppm/° C., and the coefficient of linear thermal expansion of an encapsulation material is several tens of ppm/° C. Therefore, in the semiconductor package 100 in this embodiment, an insulating layer having a coefficient of linear thermal expansion of 100 to 200 ppm/° C., preferably 100 to 150 ppm/° C. in a temperature range of 200° C. or lower is used. The condition of the "temperature range of 200° C. or lower" is based on that the upper limit of the temperature in the production of a semiconductor package is about 200° C. A reason for providing such a condition is that it is desirable that the coefficient of linear thermal expansion of the stress relaxation layer 102 is within the above-described range during the production of the semiconductor package 100.

In the semiconductor package 100 in embodiment 1 according to the present invention, it is desirable to use, for the stress relaxation layer 102, an adhesive material having a 5% weight reduction temperature of 300° C. or higher. This condition is provided for the following reason. A general reflow temperature is around 260° C. An insulating layer having a weight thereof not reduced much even after being subjected to a reflow process (namely, an insulating layer having a reflow resistance) is used, so that reduction of reliability of the semiconductor package 100 is prevented.

The "weight reduction temperature" is one of indexes used to show the thermal resistance of a substance. A tiny amount of substance is gradually heated from room temperature while nitrogen gas or air flows, and the temperature at which the weight of the substance is reduced by a certain level is set as the "weight reduction temperature". In this example, the temperature at which the weight is reduced by 5% is used.

It is desirable to use, for the stress relaxation layer 102, a resin having an adhesive force classified to "class 0" in the cross-cut adhesion test of JIS (old JIS K5400) to both of the support substrate (substrate formed of a typical metal material such as an iron alloy, a copper alloy or the like) 101 and the first encapsulation material (e.g., epoxy-based, phenol-based, or polyimide-based resin) 105. Use of such a resin increases the adhesiveness between the support substrate 101 and the first encapsulation material 105 and thus suppresses the first encapsulation material 105 from being peeled off.

As described above, for the stress relaxation layer 102 in the semiconductor package 100 in embodiment 1 according to the present invention, an insulating layer fulfilling at least one of (preferably, both of) the conditions that (1) where the elastic modulus of the support substrate 101 is A, the elastic modulus of the stress relaxation layer 102 is B, and the elastic modulus of the first encapsulation material is C under the same temperature condition, the relationship of A>C>B or C>A>B is obtained; and (2) where the coefficient of linear thermal expansion of the support substrate 101 is a, the coefficient of linear thermal expansion of the stress relaxation layer 102 is b, and the coefficient of linear thermal expansion of the first encapsulation material 105 is c under the same temperature condition, the relationship of a≤c<b (or a≈c<b) is obtained.

Use of such an insulating layer alleviates the internal stress caused due to a difference in the properties values between the support substrate 101 and the first encapsulation material 105 and thus suppresses the warp of the support substrate 101 and the first encapsulation material 105 to a minimum possible level. This improves the reliability of the semiconductor package 100.

<Production Method>

FIG. 3 though FIG. 6 show steps of a method for producing the semiconductor package 100 in embodiment 1 according to the present invention. As shown in FIG. 3A, the stress relaxation layer 102 is formed on the support substrate 101. In this example, the support substrate 101 is formed of stainless steel (SUS), which is an iron alloy. Alternatively, the support substrate 101 may be formed of any other material having a certain degree of rigidity. For example, the support substrate 101 may be formed of glass, silicon, ceramic, or an organic material.

The stress relaxation layer 102 is formed of a thermosetting resin and has a thickness of 10 to 200 µm. As described above, the stress relaxation layer 102 fulfills at least one of (desirably, both of) the conditions that (1) where the elastic modulus of the support substrate 101 is A, the elastic modulus of the stress relaxation layer 102 is B, and the elastic modulus of the first encapsulation material is C under the same temperature condition, the relationship of A>C>B or C>A>B is obtained; and (2) where the coefficient of linear thermal expansion of the support substrate 101 is a, the coefficient of linear thermal expansion of the stress relaxation layer 102 is b, and the coefficient of linear thermal expansion of the first encapsulation material 105 is c under the same temperature condition, the relationship of a≤c<b (or a≈c<b) is obtained.

Desirably, the stress relaxation layer 102 is formed of a resin having an adhesive force classified to "class 0" in the cross-cut adhesion test of JIS (old JIS K5400) to both of the support substrate 101 and the first encapsulation material 105.

After the stress relaxation layer 102 is formed, as shown in FIG. 3B, the semiconductor devices 104 are formed on the stress relaxation layer 102 with the adhesive members 103. In this example, the adhesive members 103 are each formed of a known die attach film.

This will be described specifically. First, a plurality of semiconductor devices (semiconductor elements) is formed on a wafer by a known semiconductor process. In the state where a die attach film is bonded on the semiconductor devices, a backgrinding process (process of thinning the wafer) is performed. Then, the plurality of semiconductor devices provided with the die attach film are separated divided into individual devices by a dicing process. The plurality of individual semiconductor devices 104 each with the adhesive member (die attach film) 103 are bonded to the stress relaxation layer 102. The plurality of semiconductor devices 104 are located on the support substrate 101, and the semiconductor packages 100 are formed. After this, the plurality of semiconductor packages 100 are separated into individual packages. In this way, the mass productivity of the semiconductor packages 100 is significantly improved.

Next, as shown in FIG. 3C, the first encapsulation material 105 is formed so as to cover the semiconductor devices 104. The first encapsulation material 105 may be formed of one of an epoxy-based resin, a phenol-based resin and a polyimide-based resin. Such a resin may be a thermosetting resin or a photocurable resin. The first encapsulation material 105 may be formed by screen printing, spin coating or any other known application method.

Then, the first encapsulation material 105 is patterned by a known photolithography technique or known laser processing to form a plurality of openings 105a (FIG. 4A). These openings 105a are formed in order to guarantee electrical connection between the first line layers 106 formed later and the semiconductor devices 104.

Next, as shown in FIG. 4B, a copper seed layer 106a is formed so as to cover the first encapsulation material 105 and the openings 105a. The copper seed layer 106a acts as an underlayer for copper plating. The copper seed layer 106a contains copper, nickel, nickel-chrome, titanium, titanium-tungsten or the like as a main component, and is formed by, for example, sputtering.

Next, as shown in FIG. 4C, a resist mask 21 covering the copper seed layer 106a is formed. The resist mask 21 may be formed as follows. A resist material is applied to the copper seed layer 106a by a known method (for example, spin coating method), and openings 21a are formed by a photolithography technique or laser processing. The openings 21a act as areas in which the copper lines 106b described later are formed.

Then, the copper lines 106b are formed on the copper seed layer 106a by copper plating (FIG. 5A). The copper plating may be performed by electric plating or electroless plating. In this embodiment, the copper lines 106b are formed by copper plating. The present invention is not limited to this. The copper lines 106b may be formed by any other method, for example, sputtering or vapor deposition.

Next, as shown in FIG. 5B, the resist mask 21 is removed. Then, as shown in FIG. 5C, the copper seed layer 106a is etched away using the copper lines 106b as masks. As a result of the copper seed layer 106a being etched away, the copper lines 106b are electrically isolated from each other and each act as a first line layer 106.

Figure 6A:
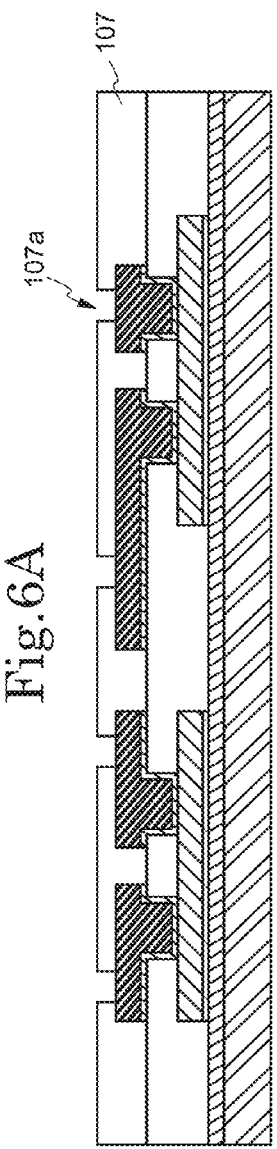
FIG. 6A shows a step of the method for producing the semiconductor package in embodiment 1 according to the present invention.

Next, the second encapsulation material 107 is formed, and openings 107a are formed by a photolithography technique or laser processing (FIG. 6A). The formation of the second encapsulation material 107 is substantially the same as the formation of the first encapsulation material 105 and will not be described in detail. The openings 107a are provided to electrically connect the external terminals 110 described later and the first line layers 106 to each other.

Figure 6B:
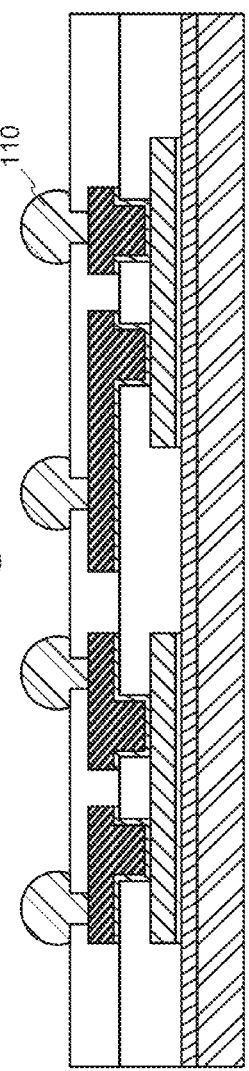
FIG. 6B shows a step of the method for producing the semiconductor package in embodiment 1 according to the present invention.

Next, as shown in FIG. 6B, the external terminals 110 (in this example, solder balls) 110 are formed so as to fill the openings 107b formed in the second encapsulation material 107. The external terminals 110 may be formed by any known method. In this example, the external terminals 110 are formed by a reflow process at 260° C. The external terminals 110 may be pin-shaped metal conductive members instead of the solder balls.

Figure 6C:
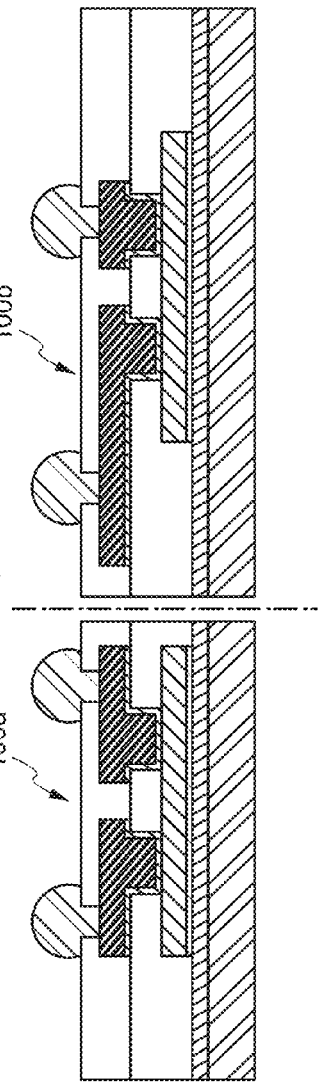
FIG. 6C shows a step of the method for producing the semiconductor package in embodiment 1 according to the present invention.

Then, in a final step, as shown in FIG. 6C, the resultant structure formed on the support substrate 101 is cut into individual semiconductor devices 104 (individual semiconductor packages 100) by a known singlation process. In this manner, a plurality of semiconductor packages 100a and 100b are formed.

In the production method shown in FIG. 3 through FIG. 6, the external terminals 110 are connected to the first line layers 106. Alternatively, as shown in FIG. 2, the second line layers 108 may be formed before the external terminals 110 are formed.

The semiconductor package 100 in embodiment 1 according to the present invention shown in FIG. 1 is completed by the above-described production method. According to the present invention, the stress relaxation layer 102 fulfilling the predetermined conditions described above is provided on the support substrate 101. This alleviates the internal stress caused due to a difference in property values between the support substrate 101 and the first encapsulation material 105 in a heating step performed later in the production method (the step of curing of the thermosetting resin or the reflow process performed to form the solder balls). Therefore, the warp of the support substrate 101 and the first encapsulation material 105 is suppressed to a minimum possible level throughout the production method.

Embodiment 2

FIG. 7A is a cross-sectional view of a semiconductor package 200 in embodiment 2 according to the present invention. The semiconductor package 200 in embodiment 2 includes a conductive layer 31 provided on the stress relaxation layer 102, unlike the semiconductor package 100 in embodiment 1. Except for this, the semiconductor package 200 in embodiment 2 is substantially the same as the semiconductor package 100 in embodiment 1.

Referring to FIG. 7A, the conductive layer 31 may be formed of any material such as copper, aluminum, silver or the like. Desirably, the conductive layer 31 is formed of a metal material having a high thermal conductivity in order to release heat from the semiconductor devices 104 efficiently.

Figure 7B:
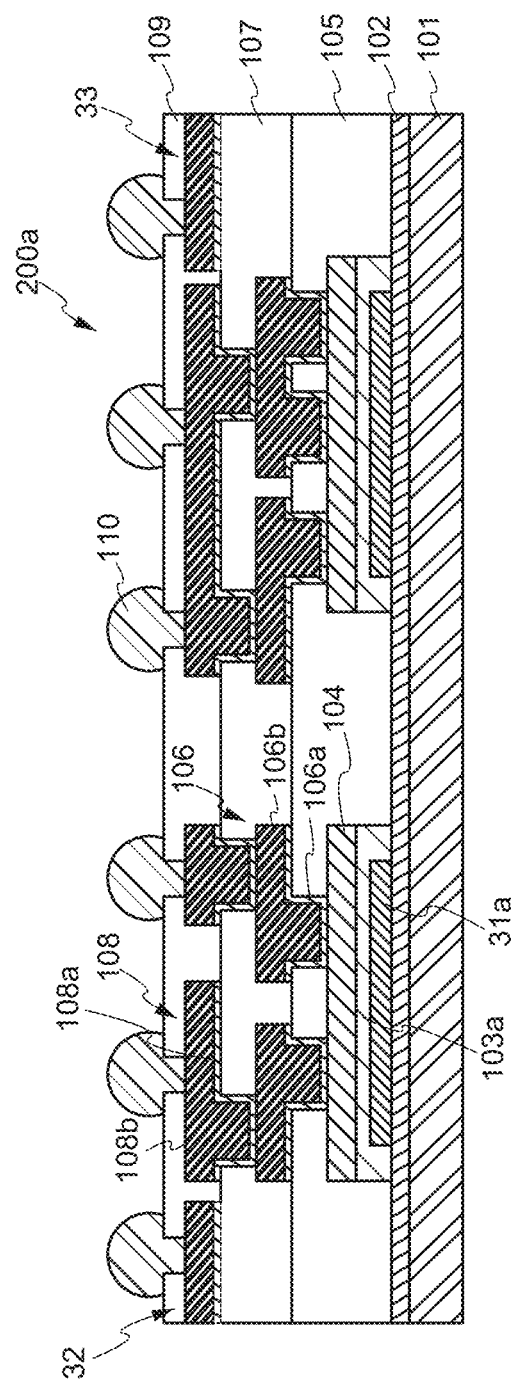
FIG. 7B is a cross-sectional view of a semiconductor package in embodiment 2 according to the present invention.
Figure 8A:
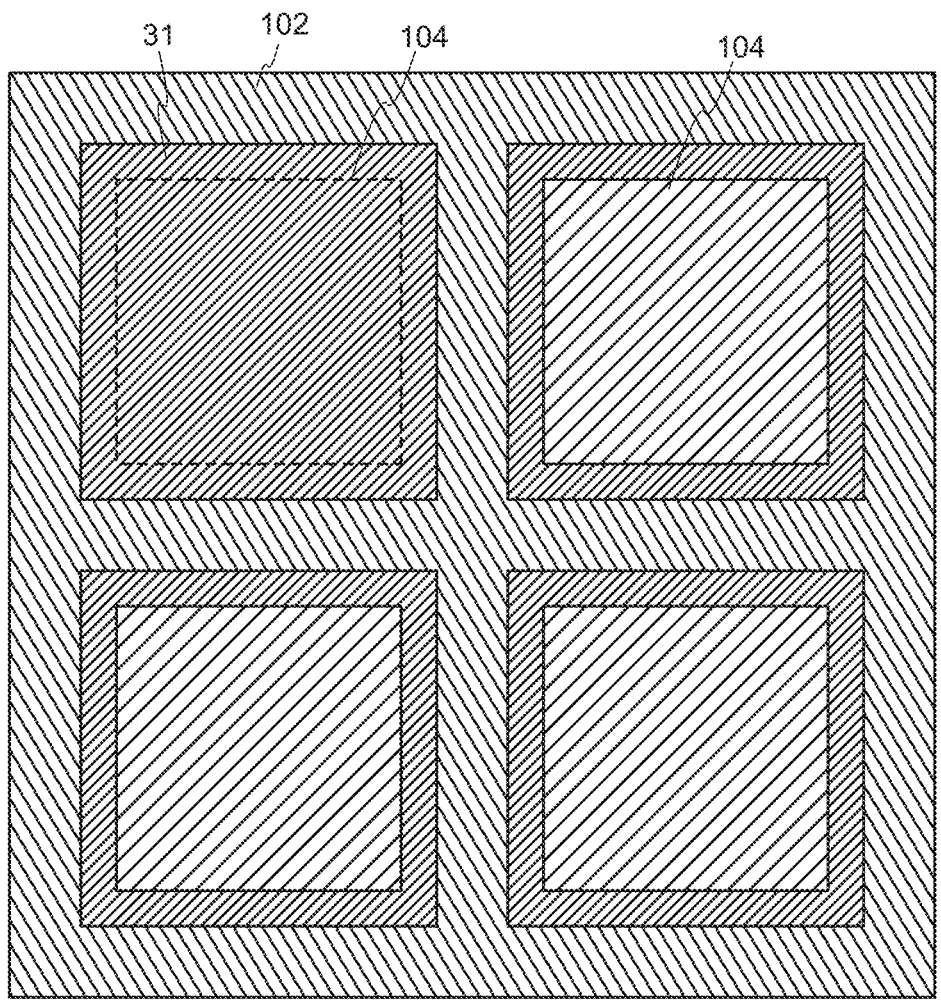
FIG. 8A is a plan view of a part of the semiconductor package in embodiment 2 according to the present invention.

As shown in FIG. 8A, the conductive layers 31 in the semiconductor package 200 shown in FIG. 7A each have a rectangular or square shape and are provided below the semiconductor devices 104 in order to improve the effect of releasing heat from the entire area below the semiconductor devices 104. Needless to say, the shape of the conductive layer 31 is not limited to rectangular or square and may be any shape. In FIG. 8A, the dashed line represents the outline of each semiconductor device 104. The semiconductor device 104 is located so as to have the outline thereof inside the respective conductive layer 31 as seen from above.

As shown in FIG. 7A, the conductive layer 31 is electrically connected to copper lines 32 and 33 provided in an upper layer, respectively. In this example, the conductive layer 31 is electrically connected to the copper lines 32 and 33 among the second line layers 108 provided on the second encapsulation material 107. Alternatively, the conductive layer 31 may be electrically connected to the first line layers 106 provided on the first encapsulation material 105. Therefore, the conductive layer 31 may act as a line, or as a load element such as an electrical capacitor, a resistor, an inductor or the like.

Figure 8B:
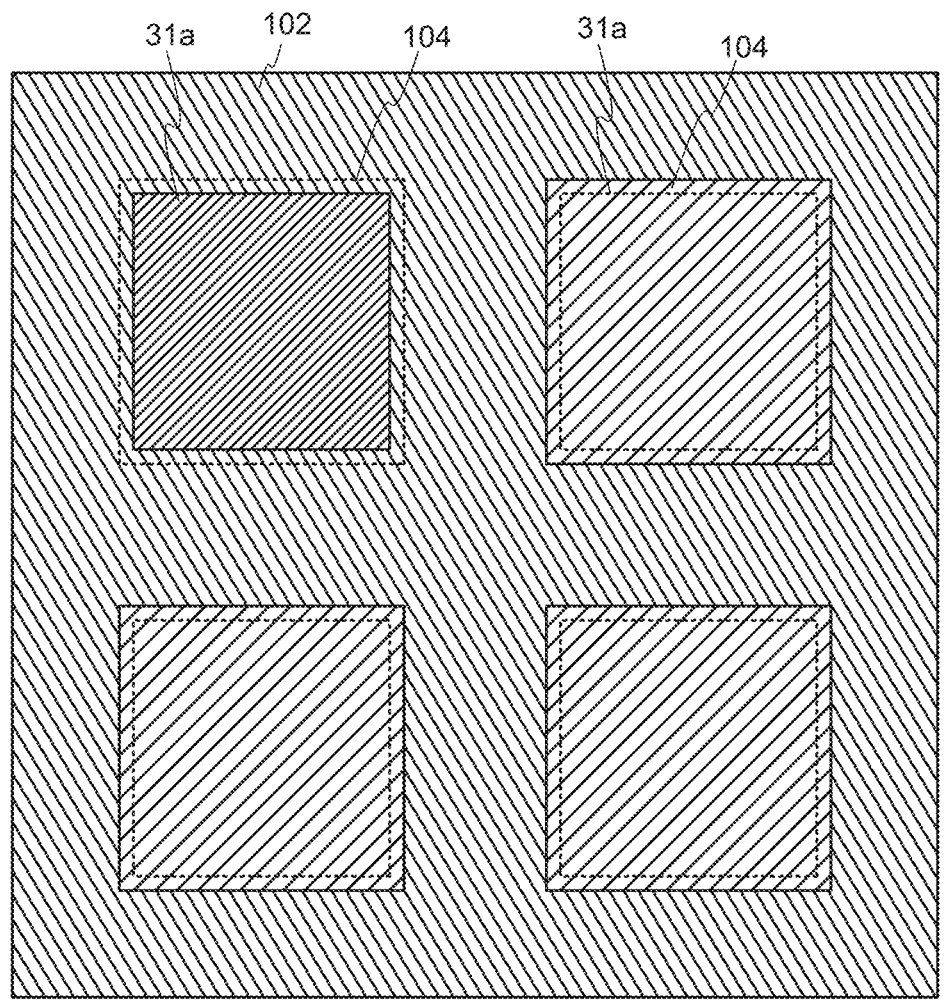
FIG. 8B is a plan view of a part of the semiconductor package in embodiment 2 according to the present invention.

FIG. 7B is a cross-sectional view of another semiconductor package 200a in embodiment 2 according to the present invention. As shown in FIG. 7B, a conductive layer 31a may be located inside the outline of each semiconductor device 104. A stepped portion formed as a result of the provision of the conductive layer 31a is buried by an adhesive member 103a; namely, the adhesive member 103a is used as a flattening layer. In this case, the adhesive member 103a is desirably formed of a material having a sufficient level of fluidity at the time of bonding the semiconductor device 104 to the conductive layer 31a. As shown in FIG. 8B, in the semiconductor package 200a, the conductive layer 31a has an outline located inside the outline of the semiconductor device 104.

As described above, the conductive layer 31 provided in the semiconductor package 200 and 200a in embodiment 2 acts as a line that connects elements formed in the semiconductor device 104 or as a load element forming any of various functional circuits. Therefore, the semiconductor package 200 in embodiment 2 provides an effect of improving the freedom of circuit design in addition to the effects provided by the semiconductor package 100 in embodiment 1.

In addition, the conductive layer 31 formed of a metal material having a high thermal conductivity is provided below the corresponding semiconductor device 104. This improves the heat releasing effect from the semiconductor device 104. Thus, the semiconductor package 200 has a high heat releasing property and thus is highly reliable.

Embodiment 3

Figure 9A:
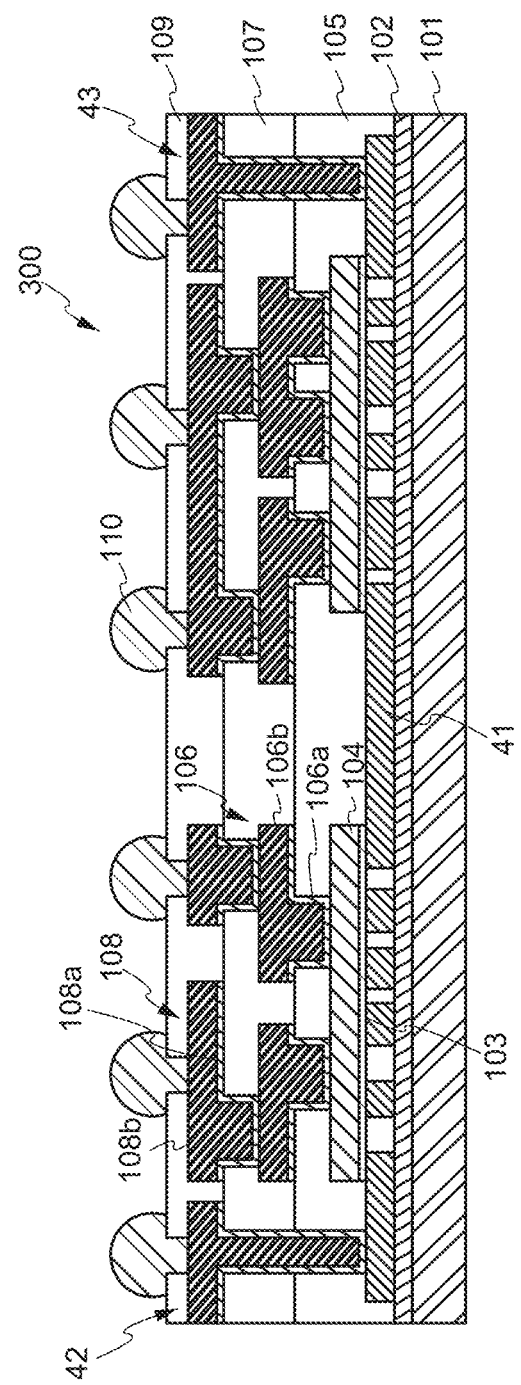
FIG. 9A is a cross-sectional view of a semiconductor package in embodiment 3 according to the present invention.

FIG. 9A is a cross-sectional view of a semiconductor package 300 in embodiment 3 according to the present invention. In the semiconductor package 300 in embodiment 3, a conductive layer 41 provided on the stress relaxation layer 102 is patterned so as to actively act as a line, unlike in the semiconductor package 200 in embodiment 2. Except for this, the semiconductor package 300 in embodiment 3 is substantially the same as the semiconductor package 200 in embodiment 2.

Figure 10:
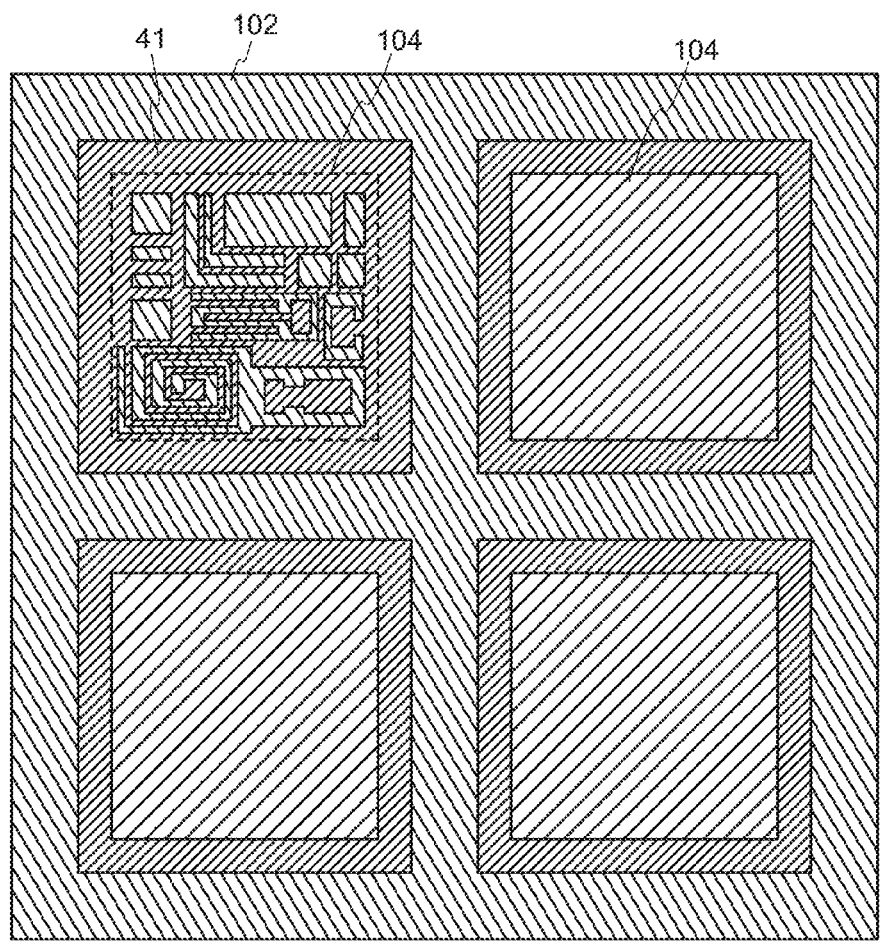
FIG. 10 is a plan view of a part of the semiconductor package in embodiment 3 according to the present invention.

Referring to FIG. 9A, the conductive layer 41 may be formed of any material such as copper, aluminum, silver or the like. In FIG. 9A, the conductive layer 41 appears to be divided by patterning into a plurality of parts. In actuality, however, as shown in FIG. 10, the patterned parts of each conductive layer 41 are electrically connected to each other and act as a line that connects elements formed in the semiconductor device 104 or as any of various load elements.

The load elements which may be formed by each conductive layer 41 include, for example, an electrical capacitor, a resistor, an inductor, and the like. Needless to say, any other element which can be formed by patterning the conductive layer 41 may be formed.

As shown in FIG. 9A, the conductive layer 41 is electrically connected to copper lines 42 and 43 provided in an upper layer, respectively. In this example, the conductive layer 41 is electrically connected to the copper lines 42 and 43 among the second line layers 108 provided on the second encapsulation material 107. Alternatively, the conductive layer 41 may be electrically connected to the first line layers 106 provided on the first encapsulation material 105.

Figure 9B:
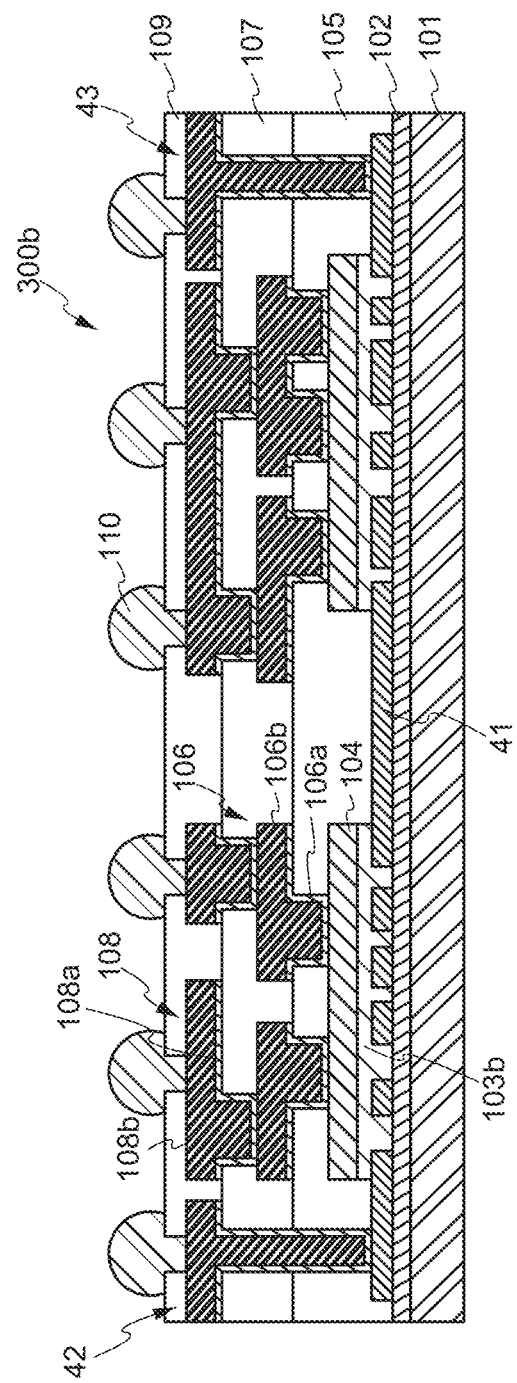
FIG. 9B is a cross-sectional view of a semiconductor package in embodiment 3 according to the present invention.
Figure 9C:
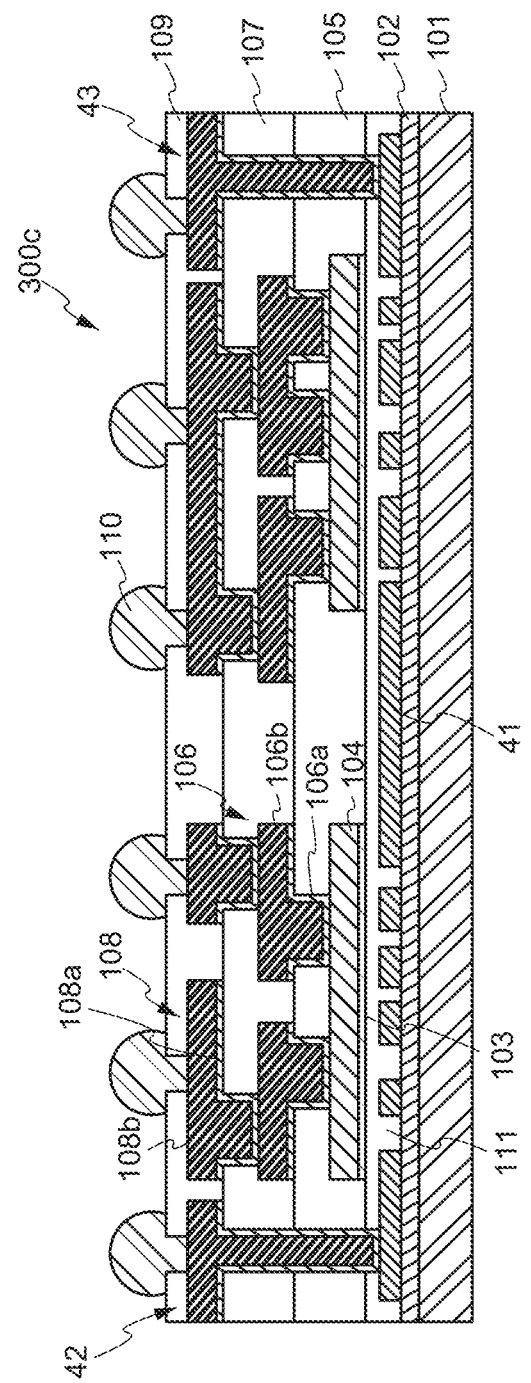
FIG. 9C is a cross-sectional view of a semiconductor package in embodiment 3 according to the present invention.

FIG. 9B is a cross-sectional view of another semiconductor package 300b in embodiment 3 according to the present invention. As shown in FIG. 9B, a stepped portion formed as a result of the provision of the conductive layer 41 is buried by an adhesive member 103b; namely, the adhesive member 103b is used as a flattening layer. In this case, the adhesive member 103b is desirably formed of a material having a sufficient level of fluidity at the time of bonding the semiconductor device 104 to the conductive layer 41. FIG. 9C is a cross-sectional view of still another semiconductor package 300c in embodiment 3 according to the present invention. As shown in FIG. 9C, a stepped portion formed as a result of the provision of the conductive layer 41 may be buried by a flattening layer 111, and the semiconductor device 104 may be provided on the flattening layer 111 with the adhesive member 103 being provided between the flattening layer 111 and the semiconductor device 104. The flattening layer 111 may be formed of a known resin material. For example, the flattening layer 111 may be formed of the same material as that of the stress relaxation layer 102 or formed of the same material as that of the first encapsulation material 105.

As described above, the conductive layer 41 provided in the semiconductor package 300, 300b and 300c in embodiment 3 acts as a line that connects elements formed in the semiconductor device 104 or as a load element forming any of various functional circuits. Therefore, the semiconductor package 300 in embodiment 3 provides an effect of improving the freedom of circuit design in addition to the effect provided by the semiconductor package 200 in embodiment 2.

Embodiment 4

Figure 11:
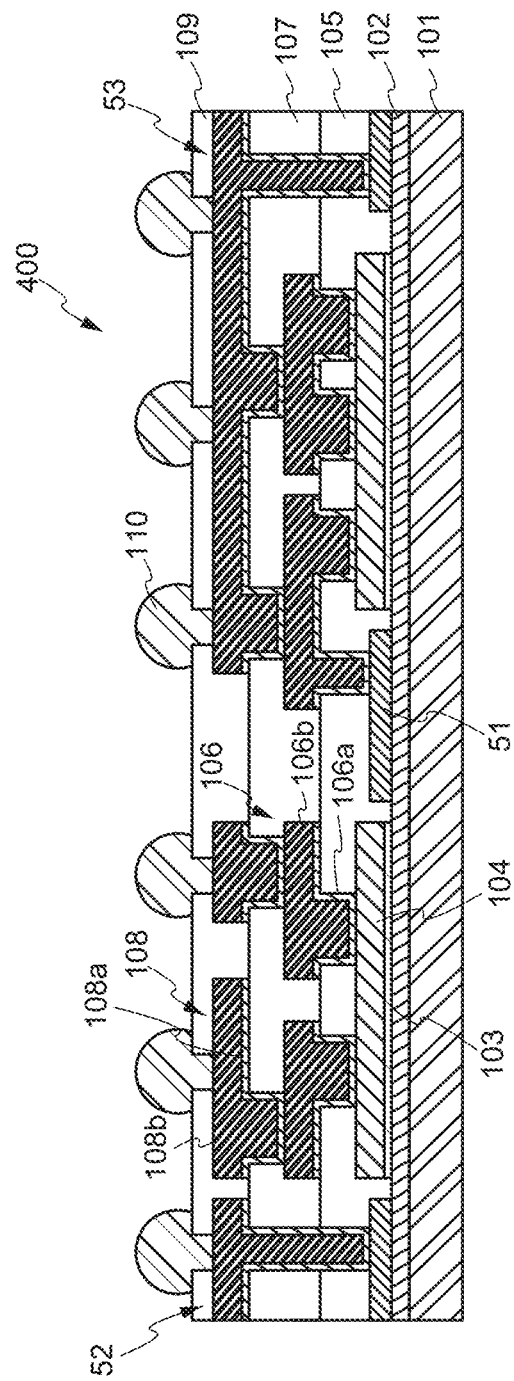
FIG. 11 is a cross-sectional view of a semiconductor package in embodiment 4 according to the present invention.

FIG. 11 is a cross-sectional view of a semiconductor package 400 in embodiment 4 according to the present invention. In the semiconductor package 400 in embodiment 4, a conductive layer 51 is provided on the stress relaxation layer 102 but not below the semiconductor device 104. Except for this, the semiconductor package 400 in embodiment 4 is substantially the same as the semiconductor package 200 in embodiment 2.

Figure 12:
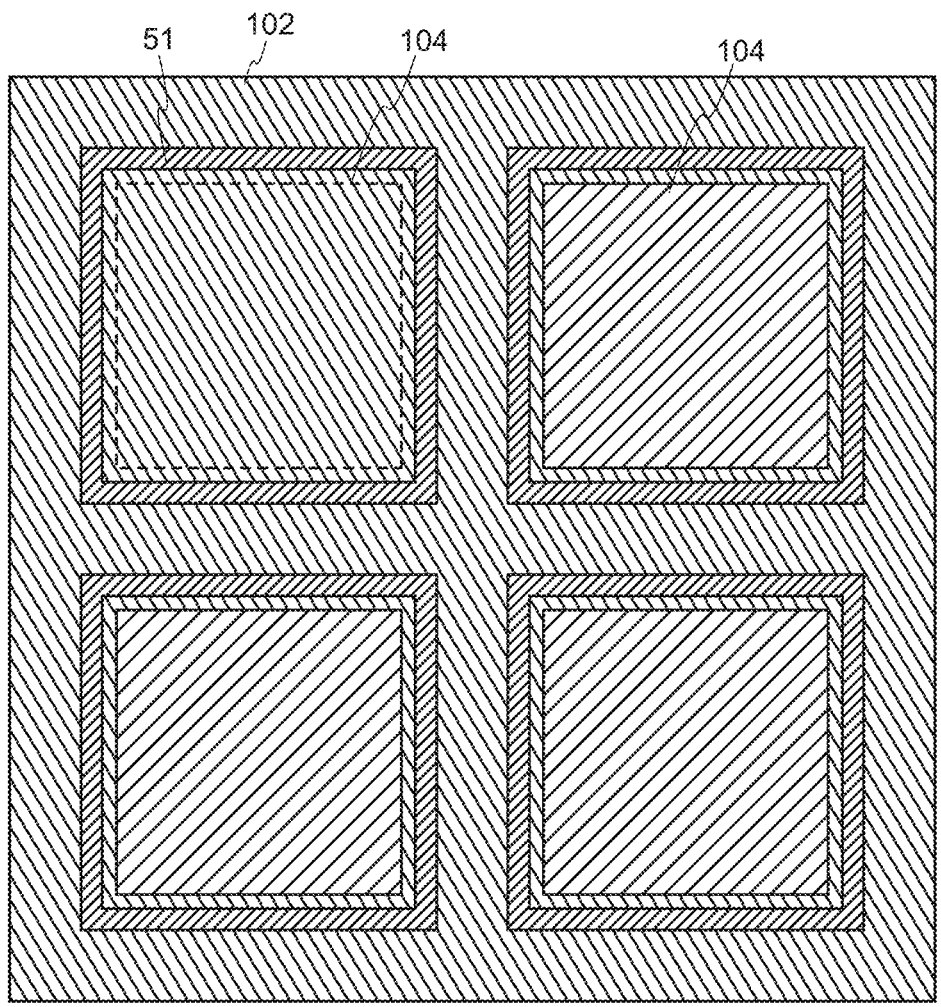
FIG. 12 is a plan view of a part of the semiconductor package in embodiment 4 according to the present invention.

In the semiconductor package 400 shown in FIG. 11, the conductive layer 51 is not provided below the semiconductor device 104. Therefore, the distance between each semiconductor device 104 and the support substrate 101 is shortened by the thickness of the conductive layer 51. Specifically, the conductive layer 51 is etched to expose the stress relaxation layer 102, and the semiconductor device 104 is located on the exposed area of the stress relaxation layer 102. FIG. 12 is a plan view of the support substrate 101, the stress relaxation layer 102, the semiconductor devices 104 and the conductive layer 51 shown in FIG. 11. As shown in FIG. 12, each conductive layer 51 has an outline outer to the outline of the semiconductor device 104, and has an area corresponding to the semiconductor device 104 removed; namely, the conductive layer 51 surrounds the semiconductor device 104.

In this case also, as shown in FIG. 11, the conductive layer 51 is electrically connected to copper lines 52 and 53 provided in an upper layer, respectively. In this example, the conductive layer 51 is electrically connected to the copper lines 52 and 53 among the second line layers 108 provided on the second encapsulation material 107. Alternatively, the conductive layer 51 may be electrically connected to the first line layers 106 provided on the first encapsulation material 105.

As described above, the conductive layer 51 formed in the semiconductor package 400 in embodiment 4 provides an effect of reducing the entire thickness of the semiconductor package 400, in addition to the effects provided by the semiconductor packages 100 and 200 in embodiments 1 and 2.

Embodiment 5

Figure 13:
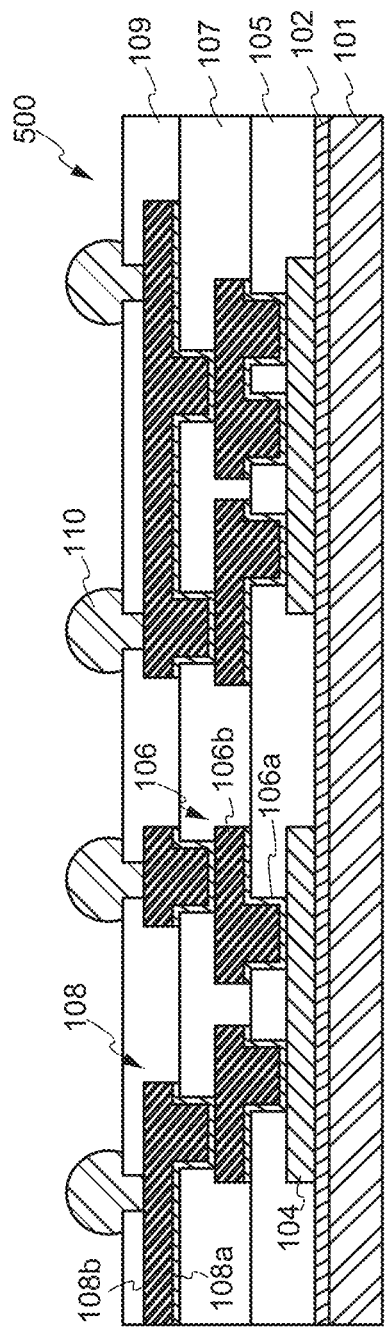
FIG. 13 is a cross-sectional view of a semiconductor package in embodiment 5 according to the present invention.

FIG. 13 is a cross-sectional view of a semiconductor package 500 in embodiment 5 according to the present invention. The semiconductor package 500 in embodiment 5 does not include the adhesive member 103, unlike the semiconductor package 100 in embodiment 1. Except for this, the semiconductor package 500 in embodiment 5 is substantially the same as the semiconductor package 100 in embodiment 1.

In the semiconductor package 500 in embodiment 5, the semiconductor devices 104 are located directly on the stress relaxation layer 102 without the adhesive member 103 being used. Specifically, the semiconductor devices 104 may be located on the stress relaxation layer 102 as follows. A resin to be formed into the stress relaxation layer 102 is provided. Before the resin is cured (baked), the semiconductor devices 104 are located on the resin, and the resin is cured in this state.

This does not require use of the die attach film or the like. Therefore, the possibility of occurrence of the stress is decreased as compared with in the semiconductor package 100 in embodiment 1. In addition, the semiconductor package 500 is made thinner by the thickness of the adhesive member 103, and thus is reduced in size.

Embodiment 6

In the semiconductor packages 100 through 500 in embodiments 1 through 5 described above, the semiconductor devices 104 are formed on the stress relaxation layer 102. In this step, the semiconductor devices 104 need to be located at accurate positions. However, in the case where the stress relaxation layer 102 is provided on the support substrate 101, even though alignment marks are provided on the support substrate 101, it is expected to be difficult to check the alignment marks due to the presence of the stress relaxation layer 102.

In order to avoid this, in a semiconductor package 600 in embodiment 6 according to the present invention, alignment marks are provided that realize accurate alignment of the semiconductor devices 104 to the stress relaxation layer 102.

Figure 14A:
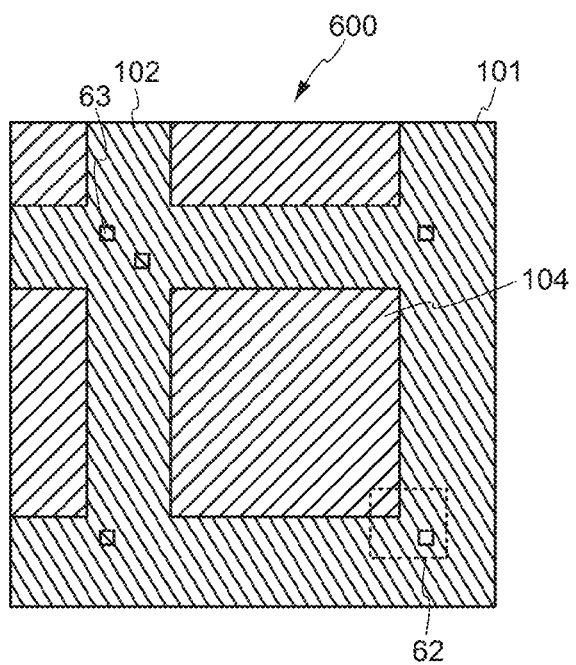
FIG. 14A is a plan view of a part of a semiconductor package in embodiment 6 according to the present invention.
Figure 14B:
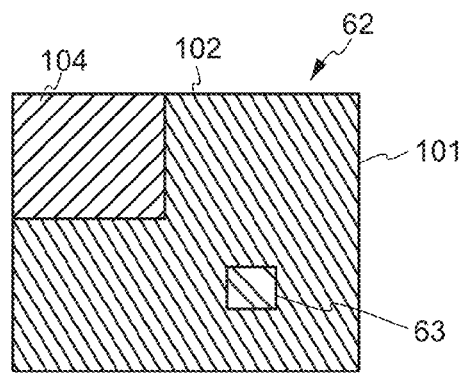
FIG. 14B is a plan view of a part of the semiconductor package in embodiment 6 according to the present invention.

FIG. 14A is a plan view showing a part of the semiconductor package 600 in embodiment 6 according to the present invention. FIG. 14B is an enlarged view of an area enclosed by the dotted line 62 in FIG. 14A.

As shown in FIG. 14A, the stress relaxation layer 102 is provided substantially on the entirety of the support substrate 101, and the plurality of semiconductor devices 104 are provided on the stress relaxation layer 102. In the semiconductor package 600 in embodiment 6, openings 63 are formed in a part of the stress relaxation layer 102 and are used as alignment marks used to locate the semiconductor devices 104.

The openings 63 may be formed by ablation performed on the stress relaxation layer 102, and a known ablation technique such as laser ablation or the like is usable. The openings 63 themselves may be used the alignment marks. Alternatively, parts of the surface of the support substrate 101 that are exposed by the openings 63 may be, for example, half-etched to form grooves, holes or the like, which are used as the alignment marks. In this case, the support substrate 101 may be etched to form the grooves, holes or the like before the stress relaxation layer 102 is formed; or the grooves, holes or the like may be formed in the support substrate 101 by laser etching or the like after the openings 63 are formed.

It is preferable to set a certain limitation on the size of the openings 63. If the openings 63 are too large, the stress relaxation layer 102 may be peeled off from the openings 63.

The present inventors found as a result of an experiment that when the length of one side of (or the diameter of) the opening 63 exceeds 480 μm, the reliability of the stress relaxation layer 102 is affected. Therefore, each opening 63 preferably has a polygonal shape having a side of a length of 480 μm or less or a circular shape having a diameter of 480 μm. The lower limit of the size of the opening 63 may slightly vary, and thus may be determined, in accordance with the material of the support substrate 101, the processing precision of forming the opening 63, and the alignment performance of a die attach device.

Now, the experiment performed by the present inventors and the results thereof will be described. The present inventors produced semiconductor packages by the method described with reference to FIG. 3 through FIG. 6, and conducted a moisture reliability test conformed to level 2 of the JEDEC Standards on the produced semiconductor packages. In the production of the semiconductor packages, the openings formed in the stress relaxation layer were used as the alignment marks as described above with reference to FIG. 14A and FIG. 14B.

The moisture reliability test was performed as follows. The semiconductor packages were kept in an atmosphere having a temperature of 85° C. and a humidity of 60% for 168 hours to cause the semiconductor packages to absorb a sufficient amount of water. Then, a standard reflow process at a temperature of 260° C. at the highest was performed on the semiconductor packages four times. After the test, the evaluation was made by use of a scanning acoustic tomograph (SAT).

Figure 15:
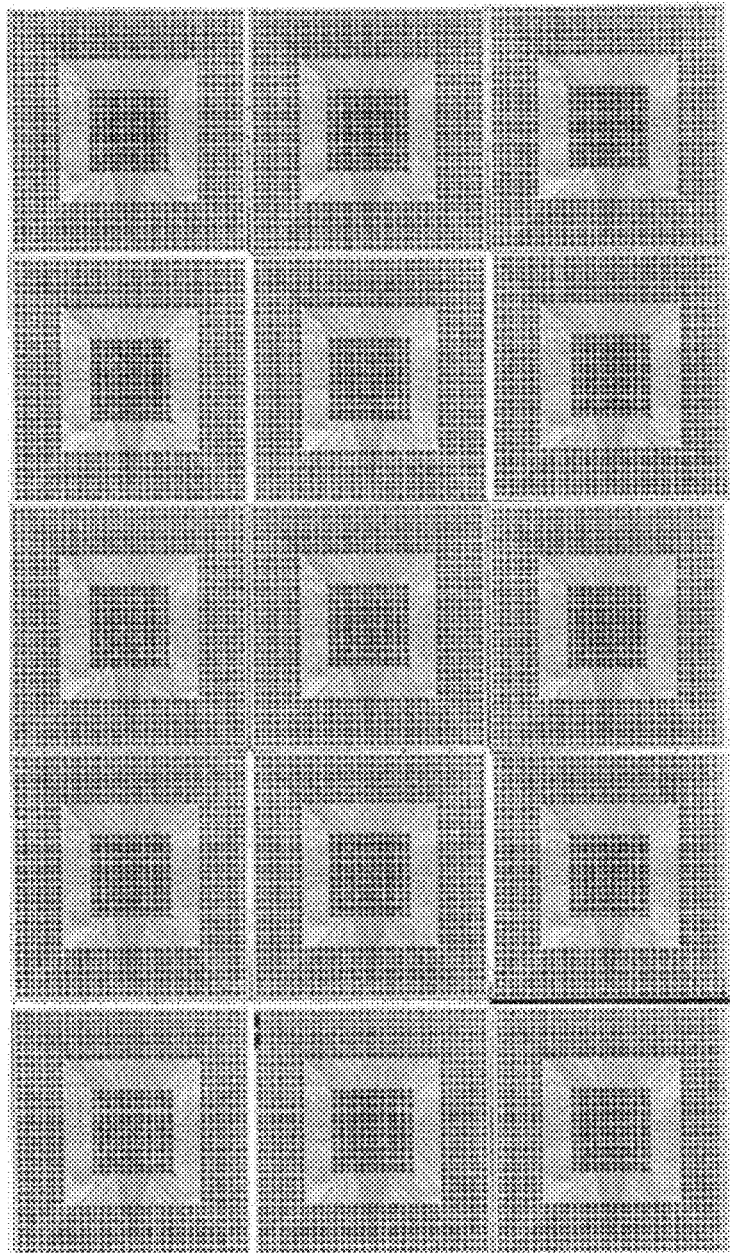
FIG. 15 shows results of a reliability test in the case where openings each having a side of a length of 400 μm are formed in embodiment 6 according to the present invention.

FIG. 15 shows the results of the reliability test in the case where openings each having a side of a length of 400 μm were formed. FIG. 16 shows the results of the reliability test in the case where openings each having a side of a length of 500 μm were formed. FIG. 17 shows the results of the reliability test in the case where openings each having a side of a length of 600 μm were formed.

As shown in FIG. 15 through FIG. 17, in the case where the length of the side of each opening was 500 μm or 600 μm, flaws were caused in the plane of the semiconductor packages. By contrast, in the case where the length of the side of each opening was 400 μm, no flaw was caused. The present inventors further conducted a moisture reliability test under a more severe condition (moisture reliability test conformed to level 1 of the JEDEC Standards) on the semiconductor packages including openings having a side of a length of 400 μm for further research.

FIG. 18A and FIG. 18B show the results of the reliability test in the case where openings each having a side of a length of 400 μm were formed. The reliability test was performed as follows. The semiconductor packages were kept in an atmosphere having a temperature of 85° C. and a humidity of 85% for 168 hours to cause the semiconductor packages to absorb a sufficient amount of water. Then, a standard reflow process at a temperature of 260° C. at the highest was performed on the semiconductor packages three times. After the test, the evaluation was made by use of the scanning acoustic tomograph described above. The results are evaluated from FIG. 18A and FIG. 18B. Before (FIG. 18A) and after (FIG. 18B) the moisture reliability test conformed to level 1 of the JEDEC Standards, the external appearance of the semiconductor packages was not changed at all. The semiconductor packages were confirmed to be highly reliable.

In consideration of these results and the processing precision (σ=6 um) used to form the alignment marks, a flaw may possibly be caused when the length of a side of (or the diameter of) the opening 63 is in the range of 500 μm±3σ. In other words, it was confirmed that when the length of a side of (or the diameter of) the opening exceeds 480 μm, the reliability of the stress relaxation layer is affected.

As described above, the semiconductor package 600 in embodiment 1 includes the openings 63, formed by ablation performed on the stress relaxation layer 102, in the vicinity of the semiconductor devices 104 (e.g., in the vicinity of corners of the semiconductor devices 104), and the openings 63 are used as the alignment marks used to locate the semiconductor devices 104 on the stress relaxation layer 102. This allow the alignment work to be made accurately, and thus improves the yield and the reliability of the method for producing the semiconductor package.

The openings 63 may each have a polygonal shape having a side of a length of 480 μm or less or a circular shape having a diameter of 480 μm or less (preferably, a polygonal shape having a side of a length of 400 μm or less or a circular shape having a diameter of 400 μm or less). In this case, the stress relaxation layer 102 is prevented from being peeled off. As a result, the advantages of the semiconductor packages in embodiments 1 through 5 are not spoiled, and the yield and the reliability of the method for producing the semiconductor package.

The present inventors produced samples under the following conditions and conducted a reliability test to confirm that the encapsulation materials were not, for example, peeled off.

Example 1

Support substrate; metal substrate (elastic modulus: 193 GPa at 25° C. and 100° C.)
Stress relaxation layer: epoxy-based resin (elastic modulus: 580 MPa at 25° C.; 4 MPa at 100° C.)
Encapsulation material (elastic modulus: 16 GPa at 25° C.; 14.7 GPa at 100° C.)

Example 2

Support substrate; metal substrate (elastic modulus: 193 GPa at 25° C. and 100° C.)
Stress relaxation layer: modified epoxy-based resin (elastic modulus: 10 MPa at 25° C.; 0.6 MPa at 100° C.)
Encapsulation material (elastic modulus: 1.8 GPa at 25° C.; 1 GPa at 100° C.)

As described above, the elastic modulus relationship among the components are adjusted such that where the elastic modulus of the support substrate 101 is A, the elastic modulus of the stress relaxation layer 102 is B, and the elastic modulus of the first encapsulation material is C under the same temperature condition, the relationship of A>C>B or C>A>B is obtained. Thus, a highly reliable semiconductor package which alleviates the internal stress caused between the support substrate and the encapsulation material is realized.

The invention claimed is:

1. A semiconductor package, comprising:
a support substrate;
a stress relaxation layer provided on and in contact with a main surface of the support substrate;
a semiconductor device located on the stress relaxation layer;
an encapsulation material covering the semiconductor device, the encapsulation material being formed of an insulating material different from that of the stress relaxation layer;
a line layer arranged on the encapsulation material and electrically connected to the semiconductor device via an opening in the encapsulation material; and
an external terminal electrically connected to the line layer.

2. A semiconductor package, comprising:
a support substrate;
a stress relaxation layer provided on and in contact with a main surface of the support substrate;
a semiconductor device located on the stress relaxation layer;
an encapsulation material covering the semiconductor device, the encapsulation material being formed of an insulating material different from that of the stress relaxation layer;
a line layer arranged on the encapsulation material and electrically connected to the semiconductor device via an opening in the encapsulation material; and
an external terminal electrically connected to the line layer,
wherein the stress relaxation layer is provided with an opening formed in the vicinity of the semiconductor device.

3. The semiconductor package according to claim 2, wherein the opening is an alignment mark, and has a polygonal shape having a side of a length of 480 μm or less or a circular shape having a diameter of 480 μm or less.

4. A semiconductor package, comprising:
a support substrate;
a stress relaxation layer provided on and in contact with a main surface of the support substrate;
a conductive layer provided on the stress relaxation layer;
a semiconductor device located on the conductive layer;
an encapsulation material covering the semiconductor device, the encapsulation material being formed of an insulating material different from that of the stress relaxation layer;
a line layer arranged on the encapsulation material and electrically connected to the semiconductor device via an opening in the encapsulation material; and
an external terminal electrically connected to the line layer.

5. The semiconductor package according to claim 4, wherein the conductive a er forms at least one of a capacitor, a resistor and an inductor.

6. A semiconductor package, comprising:
a support substrate;
a stress relaxation layer provided on and in contact with a main surface of the support substrate;
a conductive layer provided on the stress relaxation layer;
a semiconductor device located on the conductive layer;
an encapsulation material covering the semiconductor device, the encapsulation material being formed of an insulating material different from that of the stress relaxation layer;
a line layer arranged on the encapsulation material and electrically connected to the semiconductor device via an opening in the encapsulation material; and
an external terminal electrically connected to the line layer,
wherein the stress relaxation layer is provided with an opening formed in the vicinity of the semiconductor device.

7. The semiconductor package according to claim 6, wherein the opening is an alignment mark, and has a polygonal shape having a side of a length of 480 μm or less or a circular shape having a diameter of 480 μm or less.

8. A semiconductor package, comprising:
a support substrate;
a stress relaxation layer provided on and in contact with a main surface of the support substrate;
a conductive layer provided on the stress relaxation layer;
a semiconductor device surrounded by the conductive layer and located on the stress relaxation layer;
an encapsulation material covering the semiconductor device, the encapsulation material being formed of an insulating material different from that of the stress relaxation layer;
a line layer arranged on the encapsulation material and electrically connected to the semiconductor device via an opening in the encapsulation material; and an external terminal electrically connected to the line layer.

9. The semiconductor package according to claim 8, wherein the conductive layer forms at least one of a capacitor, a resistor and an inductor.

10. A semiconductor package, comprising:
   a support substrate;
   a stress relaxation layer provided on and in contact with a main surface of the support substrate;
   a conductive layer provided on the stress relaxation layer;
   a semiconductor device surrounded by the conductive layer and located on the stress relaxation layer;
   an encapsulation material covering the semiconductor device, the encapsulation material being formed of an insulating material different from that of the stress relaxation layer;
   a line layer arranged on the encapsulation material and electrically connected to the semiconductor device via an opening in the encapsulation material; and
   an external terminal electrically connected to the line layer,
   wherein the stress relaxation layer is provided with an opening formed in the vicinity of the semiconductor device.

11. The semiconductor package according to claim 10, wherein the opening is an alignment mark, and has a polygonal shape having a side of a length of 480 μm or less or a circular shape having a diameter of 480 μm or less.

* * * * *